(12) United States Patent
Sato et al.

(10) Patent No.: US 8,445,902 B2
(45) Date of Patent: May 21, 2013

(54) THIN FILM TRANSISTOR AND METHOD OF MANUFACTURING THE SAME

(75) Inventors: Ayumu Sato, Kawasaki (JP); Ryo Hayashi, Yokohama (JP); Hisato Yabuta, Machida (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 12/990,408

(22) PCT Filed: Apr. 28, 2009

(86) PCT No.: PCT/JP2009/058724
§ 371 (c)(1),
(2), (4) Date: Oct. 29, 2010

(87) PCT Pub. No.: WO2009/136645
PCT Pub. Date: Nov. 12, 2009

(65) Prior Publication Data
US 2011/0042670 A1 Feb. 24, 2011

(30) Foreign Application Priority Data
May 7, 2008 (JP) ................................. 2008-121384

(51) Int. Cl.
*H01L 29/10* (2006.01)
*H01L 29/12* (2006.01)
(52) U.S. Cl.
USPC ........................ 257/43; 257/59; 257/E29.117
(58) Field of Classification Search
USPC ....................... 257/43, 59, E29.117
See application file for complete search history.

(56) References Cited

U.S. PATENT DOCUMENTS

| 5,286,659 A | 2/1994 | Mitani et al. |
| 6,229,156 B1 | 5/2001 | Murai et al. |

(Continued)

FOREIGN PATENT DOCUMENTS

| EP | 1850386 A | 10/2007 |
| JP | H02-215162 A | 8/1990 |

(Continued)

OTHER PUBLICATIONS

Kenji Nomura et.al, "Room-temperature fabrication of transparent flexible thin-film transistors using amorphous oxide semiconductors", Nature, vol. 432 (Nov. 25, 2004), p. 488-492.

(Continued)

*Primary Examiner* — Phat X Cao
(74) *Attorney, Agent, or Firm* — Canon U.S.A., Inc. IP Division

(57) ABSTRACT

Provided are a coplanar structure thin film transistor that allows a threshold voltage to change only a little under electric stress, and a method of manufacturing the same. The thin film transistor includes on a substrate at least: a gate electrode; a gate insulating layer; an oxide semiconductor layer including a source electrode, a drain electrode, and a channel region; a channel protection layer; and an interlayer insulating layer. The channel protection layer includes one or more layers, the layer in contact with the oxide semiconductor layer among the one or more layers being made of an insulating material containing oxygen, ends of the channel protection layer are thinner than a central part of the channel protection layer, the interlayer insulating layer contains hydrogen, and regions of the oxide semiconductor layer that are in direct contact with the interlayer insulating layer form the source electrode and the drain electrode.

10 Claims, 8 Drawing Sheets

U.S. PATENT DOCUMENTS

| | | |
|---|---|---|
| 6,265,730 B1 | 7/2001 | Nakanishi et al. |
| 6,646,287 B1 | 11/2003 | Ono et al. |
| 7,145,174 B2 | 12/2006 | Chiang et al. |
| 7,189,992 B2 | 3/2007 | Wager, III et al. |
| 7,242,039 B2 | 7/2007 | Hoffman et al. |
| 7,282,782 B2 | 10/2007 | Hoffman et al. |
| 7,297,977 B2 | 11/2007 | Hoffman |
| 2002/0016028 A1 | 2/2002 | Arao et al. |
| 2005/0219435 A1 | 10/2005 | Oh et al. |
| 2007/0194379 A1 | 8/2007 | Hosono et al. |
| 2008/0142804 A1* | 6/2008 | Oh et al. .................... 257/59 |
| 2008/0258141 A1* | 10/2008 | Park et al. .................. 257/43 |
| 2008/0315202 A1* | 12/2008 | Yamazaki .................. 257/59 |

FOREIGN PATENT DOCUMENTS

| | | |
|---|---|---|
| JP | 2002-076356 A | 3/2002 |
| JP | 2007-220817 A | 8/2007 |
| JP | 2007-220817 A | 8/2008 |
| TW | 228625 | 3/2005 |
| WO | WO2007/119386 A1 | 10/2007 |

OTHER PUBLICATIONS

Ryo Hayashi et al, "Circuits using uniform TFTs based on amorphous In—Ga—Zn—O", Journal of the SID, vol. 15, Issue 11, pp. 915-921(2007).

Chang Jung Kim et. al, "Highly Stable GA2O3—In2O3—ZnO TFT for Active-Matrix Organic Light-Emitting Diode Display Application", IEEE IEDM proceedings, 2006.

Sun II Kim et. al, "New Approach for Passivation of Ga2O3—In2O3—ZnO Thin Film Transistors", IEEE IEDM proceedings, 2007.

Takaaki Miyasako et al, "Ferroelectric-gate thin-film transistors using indium-tin-oxide channel with large charge controllability", Applied Physics Letters 86, 162902 (2005).

\* cited by examiner

THIN FILM TRANSISTOR AND METHOD OF MANUFACTURING THE SAME

TECHNICAL FIELD

The present invention relates to a thin film transistor and a method of manufacturing the same. More particularly, the present invention relates to a thin film transistor that uses an oxide semiconductor and a method of manufacturing the thin film transistor.

BACKGROUND ART

Thin film transistors (TFTs) are widely used today as a switching device or a driving device in display devices such as active matrix-type liquid crystal display devices and organic electro-luminescence (EL) display devices. Thin film transistors use, for example, amorphous silicon or low-temperature poly-silicon for a semiconductor layer.

The manufacture of those TFTs requires a high temperature process, and hence it is difficult to employ a flexible substrate such as a plastic substrate or film substrate which is low in heat resistance.

Amorphous silicon TFTs, when used as a driving device, have to be large in size because the field effect mobility in this case is small (to 1 $cm^2 \cdot V^{-1} s^{-1}$). This gives rise to such problems as a difficulty in making pixels finer and reducing of the amount of current flowing into an organic EL device by a change in threshold voltage of the TFT after long-hour driving.

Low-temperature poly-silicon TFTs also have the following problems. Low-temperature poly-silicon TFTs need a correction circuit for solving unevenness that is caused by an excimer laser used to crystallize silicon, resulting in complicating the circuit design. In addition, increasing the screen size is difficult because the screen size is limited by how large an area an excimer laser can irradiate.

Meanwhile, the development of TFTs including channel layers made of an oxide semiconductor which uses ZnO as the main component has recently become active (see Japanese Patent Application Laid-Open No. 2002-076356).

Oxide semiconductors, which can be made into a film at as low a temperature as 200° C. or lower and can accordingly form a flexible TFT on a plastic substrate or a film substrate, are considered to be a possible solution for the above-mentioned problems.

A technology of using an amorphous oxide semiconductor that is made of indium, gallium, zinc, and oxygen for a channel layer of a TFT has also been disclosed recently.

It is reported in Volumes 488 and 432 of Nature (2004) that an amorphous oxide semiconductor TFT which exhibits high field effect mobility (6 to 9 $cm^2 \cdot V^{-1} s^{-1}$) can be formed at room temperature on a substrate such as a polyethylene terephthalate (PET) film. R. Hayashi et al., J. SID, Vol. 15, Issue 11, pp. 915-921 (2007) describes that TFT characteristics uniform throughout a range of 1×1 $cm^2$ can be obtained by forming an amorphous oxide semiconductor film at room temperature by the RF magnetron sputtering method. C. J. Kim et al., IEEE IEDM Proceedings, 2006 describes that a threshold voltage change of an amorphous oxide semiconductor TFT after driven for a hundred consecutive hours is much smaller compared with an amorphous silicon TFT and the amorphous oxide semiconductor TFT is highly stable under electrical stress. It is predicted in S. I. Kim et al., IEEE IEDM Proceedings, 2007 that an extrapolation value of a threshold voltage change that an amorphous oxide semiconductor TFT undergoes over 30,000 hours would be extremely low at 2 V or lower.

Oxide semiconductor TFTs are thus extremely promising as a switching device or a driving device which replaces amorphous silicon TFTs or low-temperature poly-silicon TFTs for display devices that use a flexible substrate and for organic EL display devices.

Further, technologies for enhancing the performance of oxide semiconductor TFTs are now disclosed.

Japanese Patent Application Laid-Open No. 2007-220817 discloses a method in which a gate insulating layer and a gate electrode are used as a mask to form an interlayer insulating layer containing hydrogen in a semiconductor layer of a top gate type polycrystalline oxide TFT that includes ZnO as the main component. By thus increasing the hydrogen concentration of the semiconductor layer, the resistance of the semiconductor layer is reduced and source/drain electrodes are formed in a self-aligning manner, with the result that a coplanar structure TFT is obtained. With this structure, the parasitic resistance between the source/drain regions and a channel region can be kept small, whereby current rate control is prevented. The parasitic capacitance between the source/drain regions and the gate electrode is also reduced, which provides an effect such as improved TFT operating speed.

International Publication No. WO2007/119386 discloses a method of performing hydrogen plasma treatment on an oxide semiconductor layer of a top gate type amorphous oxide semiconductor TFT with a gate insulating layer and a gate electrode as a mask. According to the above-mentioned method, the resistance of the semiconductor layer is reduced, source/drain electrodes are formed in a self-aligning manner, and a coplanar structure TFT is obtained.

However, top gate type coplanar structure TFTs in which source/drain electrodes are formed in a self-aligning manner as those disclosed in Japanese Patent Application Laid-Open No. 2007-220817 and International Publication No. WO2007/119386 need to form a gate insulating layer on the oxide semiconductor channel layer. In the case where the plasma-enhanced chemical vapor deposition (CVD) method or the sputtering method is used to form the gate insulating layer, damage caused by plasma to the oxide semiconductor channel layer becomes a problem. Further, in the case where the gate insulating layer is a silicon nitride film or a silicon oxide film that is formed by the plasma-enhanced CVD method, hydrogen contained in the film diffuses into the oxide semiconductor channel layer, thereby lowering the resistance of the oxide semiconductor. Countermeasures against those problems have to be taken, such as employing a gate insulating layer of low hydrogen content as described in Japanese Patent Application Laid-Open No. 2007-220817. However, a gate insulating layer that is low in insulating ability raises the gate leakage current of the TFT, and a defect at the interface between the gate insulating layer and the oxide semiconductor layer causes lowering of ON current and an increase in S value. For this reason, bottom gate structure TFTs, with which the method and conditions for forming a gate insulating layer can be selected without giving consideration to the problem of the lowering of oxide semiconductor resistance, are desirable.

In the case of using an amorphous semiconductor TFT as a driving device of an organic EL display device, the stability of the threshold voltage when the TFT is kept driven for a long period of time is not high enough even at a level illustrated in S. I. Kim et al., IEEE IEDM Proceedings, 2007, and a circuit for correcting the threshold voltage is necessary. Further improvement of stability under electrical stress is therefore demanded.

DISCLOSURE OF THE INVENTION

The present invention has been made in view of the above-mentioned problems, and an object of the present invention is therefore to provide a coplanar structure thin film transistor that can take a bottom gate structure and that allows the threshold voltage to change only a little under electrical stress, and a method of manufacturing the same.

According to an aspect of the present invention, there is provided a thin film transistor comprising on a substrate at least: a gate electrode; a gate insulating layer; an oxide semiconductor layer including a source electrode, a drain electrode, and a channel region; a channel protection layer; and an interlayer insulating layer, wherein the channel protection layer includes one or more layers, the layer that is in contact with the oxide semiconductor layer among the one or more layers being made of an oxide, wherein ends of the channel protection layer are thinner than a central part of the channel protection layer, wherein the interlayer insulating layer contains hydrogen, and wherein regions of the oxide semiconductor layer that are in direct contact with the interlayer insulating layer form the source electrode and the drain electrode.

According to another aspect of the present invention, there is provided a method of manufacturing a thin film transistor, the thin film transistor comprising on a substrate at least: a gate electrode; a gate insulating layer; an oxide semiconductor layer including a source electrode, a drain electrode, and a channel region; a channel protection layer; and an interlayer insulating layer, the method comprising at least the steps of: forming the gate electrode on the substrate; forming the gate insulating layer on the substrate including the gate electrode formed thereon; forming the oxide semiconductor layer on the gate insulating layer; forming the channel protection layer so that the channel region of the oxide semiconductor layer is covered with the channel protection layer by forming an insulating layer on the oxide semiconductor layer and etching the insulating layer, the channel protection layer being thinner at ends than a center thereof; and forming the source electrode and the drain electrode by forming an interlayer insulating layer that contains hydrogen on the oxide semiconductor layer on which the channel protection layer is formed and on the gate insulating layer.

According to the present invention, source/drain regions are formed by hydrogen diffusion when the interlayer insulating layer is formed with a channel protection layer as a mask, with the result that a coplanar structure TFT in which parasitic resistance between the source/drain regions and the channel region can be reduced can be manufactured. Therefore, according to the present invention, current rate control can be prevented in the coplanar structure TFT.

Further, the TFT according to the present invention includes regions having resistivity lower than that of a channel region and higher than those of the source/drain regions (hereinafter, referred to as medium-resistance regions) between the channel region and the source/drain regions. Electric field concentration at the source/drain ends is thus relieved and the hot carrier-induced degradation of the TFT can be lessened. This makes the TFT according to the present invention small in threshold voltage change under electrical stress and accordingly high in stability.

Further features of the present invention will become apparent from the following description of exemplary embodiments with reference to the attached drawings.

BEST MODE FOR CARRYING OUT THE INVENTION

Modes of carrying out a thin film transistor and a thin film transistor manufacturing method according to the present invention are described below in detail with reference to the accompanying drawings.

Figure 1:
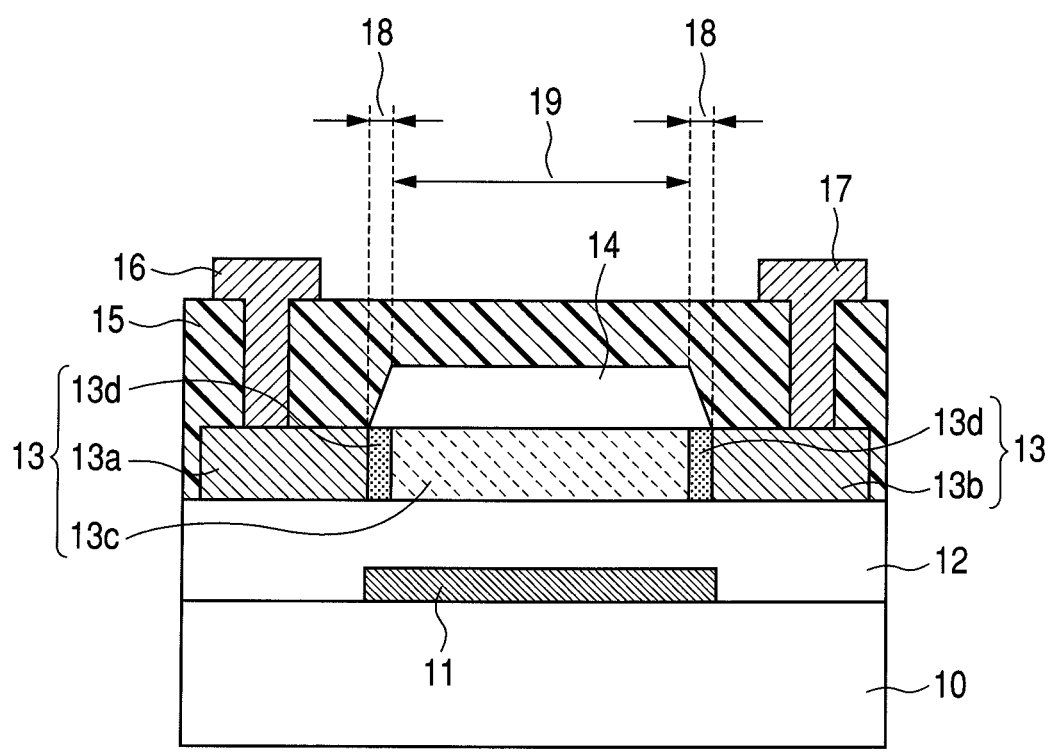
FIG. 1 is a diagram schematically illustrating a mode of carrying out a bottom gate type coplanar structure oxide semiconductor TFT of the present invention.

FIG. 1 is a schematic sectional view of a bottom gate type coplanar structure TFT as an example of how a thin film transistor of the present invention is carried out. In FIG. 1, the bottom gate type coplanar structure TFT includes a substrate 10, a gate electrode 11, a gate insulating layer 12, an oxide semiconductor layer 13, a drain electrode (region) 13a, a source electrode (region) 13b, a channel region 13c, a channel protection layer 14, an interlayer insulating layer 15, a drain wiring line 16, and a source wiring line 17. The process of manufacturing the TFT is described below step by step.

(Forming the Gate Electrode)

First, the gate electrode 11 is formed on the substrate 10. The substrate 10 can be, other than a glass substrate, a plastic film of polyethylene terephthalate (PET), polyethylene naphthalate (PEN), polyimide, polycarbonate, etc., or a thin plate, or a stainless substrate coated with an insulating layer. Methods such as a sputtering method, a pulse laser deposition (PLD) method, an electron beam deposition method, and a chemical vapor deposition (CVD) method can be employed to form the gate electrode 11. Any material that has good electric conductivity may be used for the gate electrode 11. Examples of this material include metal electrode materials which are metal such as Ti, Pt, Au, Ni, Al and Mo, and alloys of those metal elements, a laminate film of the metal electrode materials, and oxide conductors such as indium tin oxide (ITO). Next, the gate electrode 11 is patterned by a photolithography method or other methods.

(Forming the Gate Insulating Layer)

The gate insulating layer 12 is formed on the substrate 10 where the gate electrode 11 has been patterned. Methods such as a sputtering method, a pulse laser deposition (PLD) method, an electron beam deposition method, and a plasma-enhanced CVD method can be employed to form the gate insulating layer 12. Any material that has good insulating characteristics may be used for the gate insulating layer 12. Examples of the material include a silicon oxide film or silicon nitride film formed by the PECVD method or the sputtering method.

A TFT according to the present invention can have a bottom gate structure as this, which allows a channel layer to be formed after the gate insulating layer is formed. It is therefore unnecessary to give consideration to damage and hydrogen diffusion to the oxide semiconductor channel layer that are caused when the gate insulating layer is formed. As a result, the film quality, film thickness, and formation method of the gate insulating layer can be selected freely to suit the use and design, such as choosing to use a silicon nitride film that is formed by the plasma-enhanced CVD method and contains a large amount of hydrogen.

(Forming the Oxide Semiconductor Layer)

On the gate insulating layer 12, the oxide semiconductor layer 13 made from an oxide film is formed. Methods such as the sputtering method, the PLD method, and the electron beam deposition method can be used for the fabrication of the film. The oxide semiconductor layer 13 is patterned by the photolithography method and the etching method.

The oxide semiconductor layer 13 is desirably an amorphous oxide semiconductor that contains at least one type of element selected from among Sn, In, and Zn. In the case where Sn is chosen as at least one of constituent elements of the amorphous oxide semiconductor, Sn may be substituted by $Sn_{1-p}M4_p$, where p satisfies $0<p<1$ and M4 is chosen from among Si, Ge, and Zr, which are Group IV elements smaller in atomic number than Sn. With Sn substituted by one of those elements, the resistivity of the oxide semiconductor layer can be controlled.

In the case where In is chosen as at least one of constituent elements of the amorphous oxide semiconductor, In may be substituted by $In_{1-q}M3_q$, where q satisfies $0<q<1$ and M3 is chosen from among Lu and the following Group III elements smaller in atomic number than In: B; Al; Ga; and Y. With In substituted by one of those elements, the resistivity of the oxide semiconductor layer can be controlled.

In the case where Zn is chosen as at least one of constituent elements of the amorphous oxide semiconductor, Zn may be substituted by $Zn_{1-r}M2_r$, where r satisfies $0<r<1$ and M2 is chosen from between Mg and Ca, which are Group II elements smaller in atomic number than Zn. With Zn substituted by one of those elements, the resistivity of the oxide semiconductor layer can be controlled.

Specific amorphous semiconductor materials capable of being applied to the present invention include an Sn—In—Zn oxide, an In—Zn—Ga—Mg oxide, an In oxide, an In—Sn oxide, an In—Ga oxide, an In—Zn oxide, a Zn—Ga oxide, and an Sn—In—Zn oxide. A composition ratio of constituent metal atoms is not necessarily set to 1:1. Note that, although in the case where Zn or Sn is used alone and it may be difficult to produce an amorphous, when In or Ga is added thereto, an amorphous phase is easy to be produced. For example, in the case of In—Zn system, a proportion of the number of atoms except oxygen may be set to a composition containing In of about 20 atomic % or more. In the case of Sn—In system, the proportion of the number of atoms except oxygen may be set to a composition containing In of about 80 atomic % or more. In the case of Sn—In—Zn system, the proportion of the number of atoms except oxygen may be set to a composition containing In of about 15 atomic % or more.

When a thin film to be detected is subjected to X-ray diffraction at a low incident angle of about 0.5 degrees and then a clear diffraction peak is not detected (that is, halo pattern is observed), it can be determined that the thin film has the amorphous structure. Note that, according to the present invention, when the above-mentioned materials are used for the oxide semiconductor device, it is not excluded that the semiconductor layer contains a constituent material with a microcrystal state.

(Forming the Channel Protection Film)

Next, a silicon oxide film is formed by the sputtering method on the oxide semiconductor layer 13 as an insulating layer that serves as the channel protection layer 14. Photoresist is applied to the silicon oxide film and is exposed by back side exposure with the gate electrode 11 as a mask, to thereby form a resist pattern. The resist pattern is given a forward tapered shape by adjusting the temperature and length of post baking which follows the resist development. Thereafter, the resist pattern is used as a mask for dry etching that uses $CF_4$ or similar gas to form the channel protection layer 14. By mixing the etching gas with $O_2$ gas (oxidizing gas) so that part of the resist is etched at the same time when the channel protection layer 14 is etched, the channel protection layer can have a forward tapered shape that reflects the tapered shape of the resist. The taper angle can be controlled generally by varying the amount of $O_2$ gas. However, there is no particular need to mix $O_2$ gas into the etching gas if otherwise the channel protection layer 14 and part of the resist can be etched concurrently. With the ends of the channel protection layer 14 thus shaped into a forward tapered shape, the channel protection layer 14 is thinner at channel protection layer ends 18 than at a central part 19.

Figure 2A:
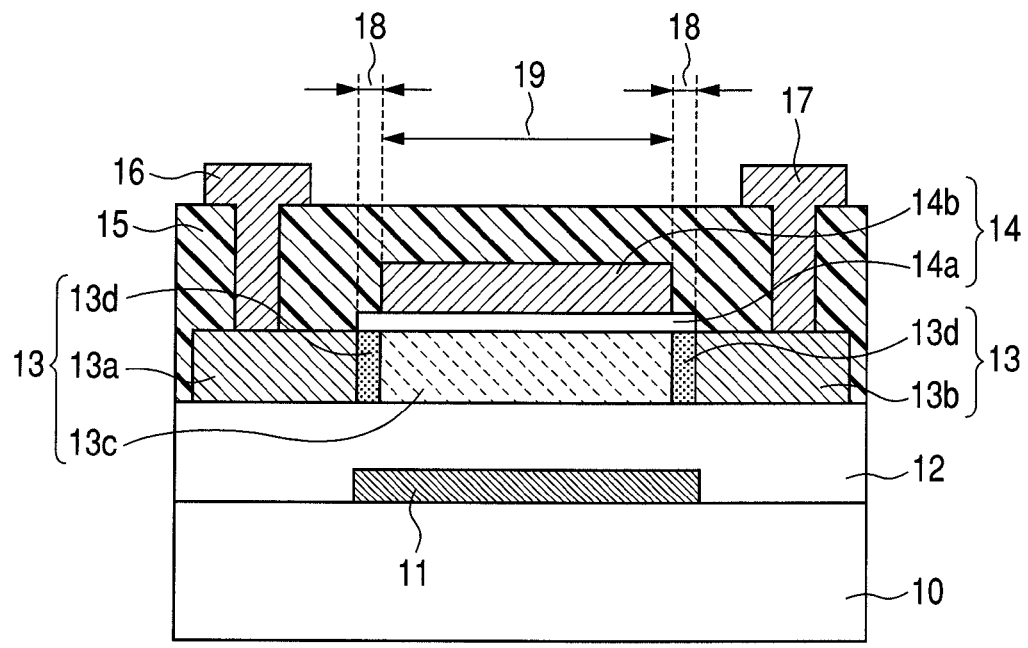
FIGS. 2A and 2B are diagrams schematically illustrating a mode of carrying out a bottom gate type coplanar structure oxide semiconductor TFT that has two channel protection layers.
Figure 2B:
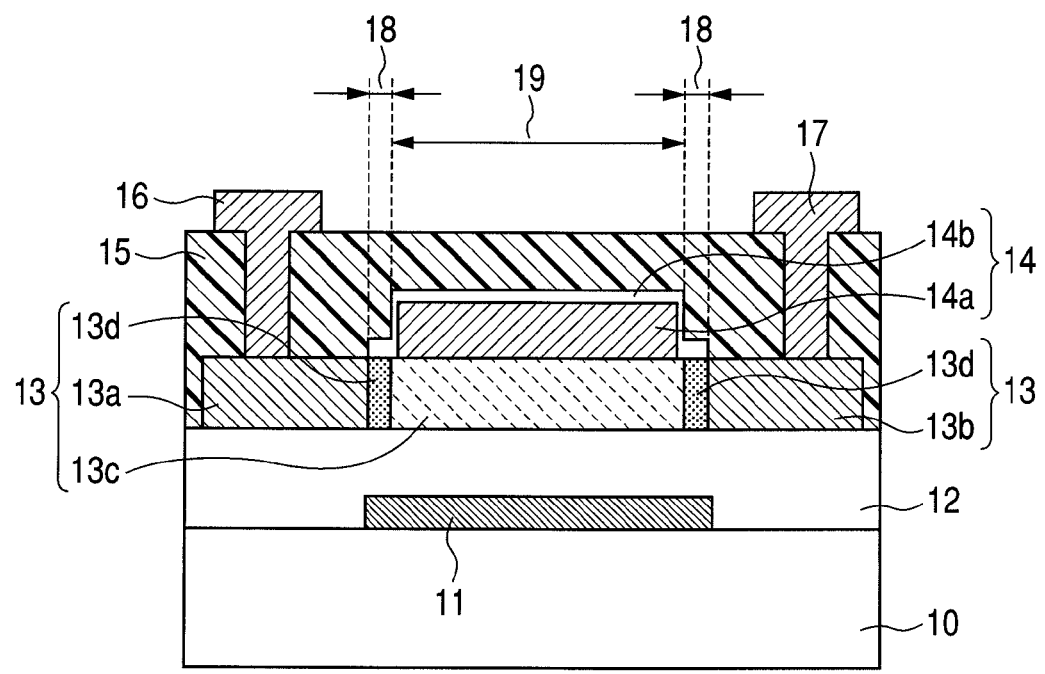

Alternatively, the channel protection layer 14 may be made thinner at the ends 18 than at the central part 19 by repeating the formation and patterning of the insulating layer while varying the exposure amount of the resist in the back side exposure and thus forming a laminate of two or more layers. The taper shape of the channel protection layer 14 in this case does not need to be a forward tapered shape in which the film thickness changes in a continuous manner. For example, when the channel protection layer 14 is formed from two layers, a first channel protection layer 14a and a second channel protection layer 14b, structures as those illustrated in FIGS. 2A and 2B can be employed. In the structure of FIG. 2A, the first channel protection layer 14a is wider than the second channel protection layer 14b. This is reversed in the structure of FIG. 2B. From the above, a channel protection layer of the present invention is characterized by being structured to have one or more layers.

Instead of the back side exposure which uses the gate electrode 11 as a mask, front side exposure which uses a conventional photomask may be employed to form the channel protection layer 14, whether it be a single layer or a laminate. In this case, there is a possibility that the parasitic capacitance between the drain/source electrodes and the gate electrode increases, but none of the effects of the present invention is lost.

The structure and functions of the channel protection layer 14 are described in more detail. The channel protection layer 14, which is in direct contact with the oxide semiconductor layer 13, is required to have a function of preventing the dropping of the resistance of the oxide semiconductor upon formation of the channel protection layer. The channel protection layer 14 is also required to have a function of controlling the hydrogen transmission amount via the channel protection layer thickness when an insulating layer containing hydrogen is formed on the channel protection layer 14, and thereby controlling the resistivity of the oxide semiconductor. Specifically, a favorable material having those functions is an oxide such as a silicon oxide film, a silicon oxynitride film, an aluminum oxide film, an yttrium oxide film, and a magnesium oxide film. The oxide desirably has insulating properties. In the present invention, an oxide film has insulating properties when the oxide film has a resistivity of $10^8$ Ω·cm or higher.

Those films easily acquire an amorphous state through the plasma-enhanced CVD method and the sputtering method which are common film formation methods and, compared to polycrystalline films which have a grain boundary, allow more uniform control of the hydrogen transmission amount irrespective of location. Also, those insulating layers raise no problems when the compositions of the insulating layers do not follow stoichiometry.

Figure 3:
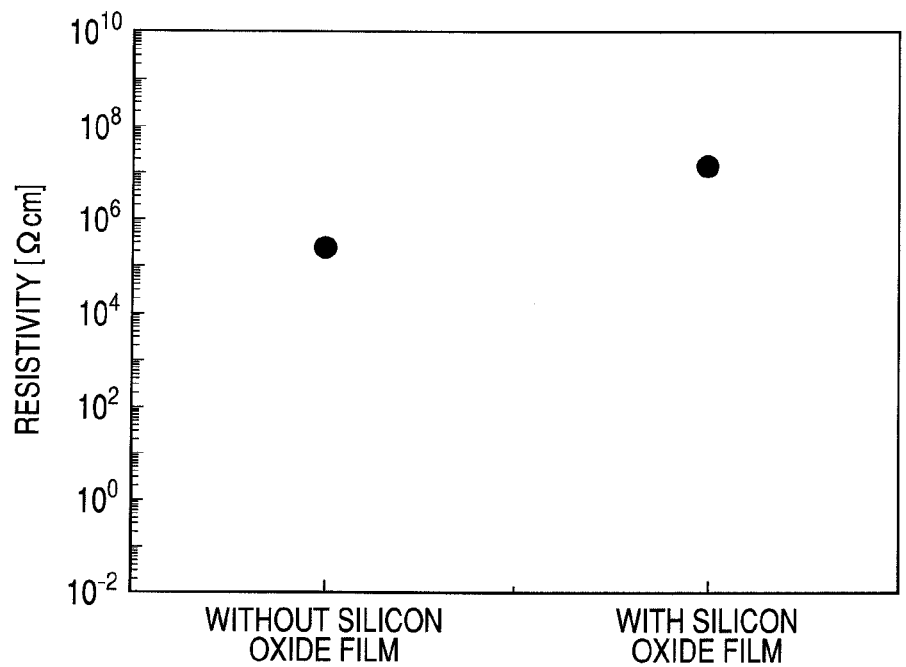
FIG. 3 is a graph illustrating a change in resistivity of an amorphous IGZO oxide semiconductor in relation to presence or absence of a silicon oxide film protection layer.

FIG. 3 illustrates the result of a resistivity comparison between an In—Ga—Zn—O-based amorphous oxide semiconductor (amorphous IGZO) layer with a silicon oxide film protection layer formed on top and the amorphous IGZO layer without the silicon oxide film protection layer formed on top. It can be seen in FIG. 3 that a protection layer formed from a silicon oxide film has a function of preventing the dropping of the resistance of an oxide semiconductor when formed on the oxide semiconductor.

Figure 4:
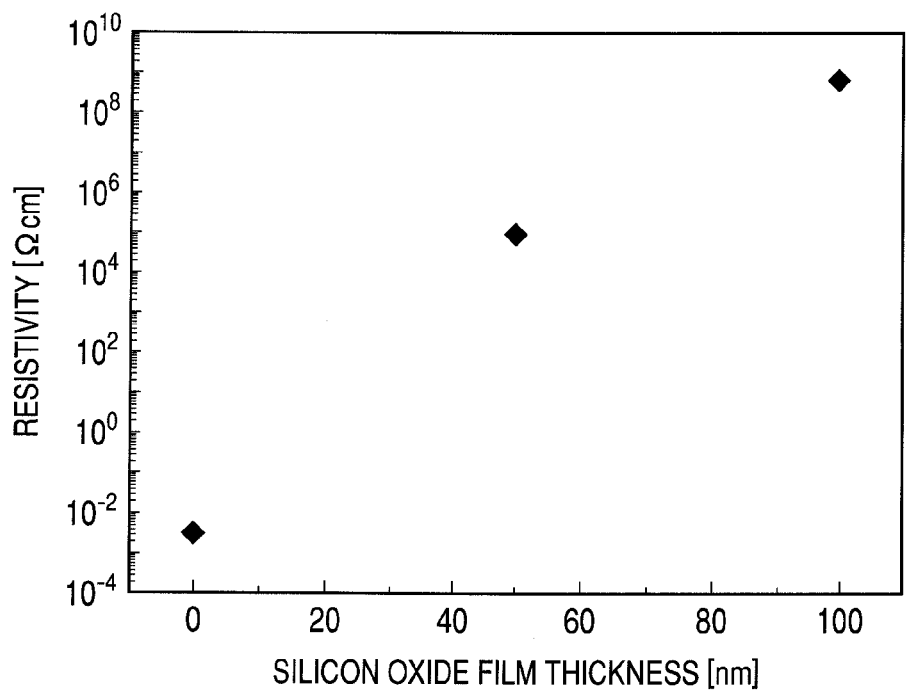
FIG. 4 is a graph illustrating the dependence of the change in resistivity of the amorphous IGZO oxide semiconductor on a thickness of the silicon oxide film protection layer.

FIG. 4 illustrates the dependence of the resistivity of the amorphous IGZO on the thickness of a silicon oxide film when an amorphous IGZO layer is formed on a glass substrate, and a silicon oxide film and then a silicon nitride film containing hydrogen are sequentially formed on the amorphous IGZO layer. The amorphous IGZO layer has a thickness of 30 nm. The silicon oxide film was set to three different thicknesses: 0 nm; 50 nm; and 100 nm. The sputtering method was used to form the amorphous IGZO layer and the silicon oxide film. The silicon nitride film containing hydrogen has a thickness of 300 nm. The silicon nitride film containing hydrogen was formed by the plasma-enhanced CVD method. $SiH_4$, $NH_3$, and $N_2$ were used as raw material gas for the deposition. FIG. 4 illustrates that the resistivity of amorphous IGZO can be controlled over a very wide range by varying the thickness of the silicon oxide film. It is concluded from the results of FIG. 3 and FIG. 4 that a silicon oxide film is desirable as a channel protection layer.

In the case of a laminate channel protection layer, a channel protection layer that is not in direct contact with the oxide semiconductor layer is not bound by the above description. For example, in the structure of FIG. 2A where the channel protection layer 14 has two layers, the second channel protection layer 14b may be a silicon nitride film. A silicon nitride film has a function of suppressing the transmission of hydrogen, and hence the second channel protection layer 14b in this case can be thinner than when formed from a silicon oxide film while providing the same level of control over the hydrogen transmission amount. The channel protection layer 14 may have two or more layers for the purpose of adjusting the hydrogen transmission amount as in this example.

Optimum thicknesses at the central part and ends of the channel protection layer (shape of the channel protection layer) greatly vary depending on the types and formation conditions of the substrate, the underlayer, the oxide semiconductor layer, the channel protection layer, and the interlayer insulating layer, and the thicknesses of other layers than the channel protection layer. The channel protection layer is therefore not limited to the thickness range illustrated in FIG. 4. What is important is that the channel protection layer is thinner at the ends than at the central part.

The above-mentioned results prove that setting the channel protection layer thinner at the ends than at the central part makes the resistivity of a part of the oxide semiconductor layer that is under the ends of the channel protection layer smaller than the resistivity of a part of the oxide semiconductor layer that is under the central part of the channel protection layer and serves as the channel region. The resistivity is even lower in a part of the oxide semiconductor layer that serves as the source/drain regions, namely, a part under a region of the silicon oxide film of FIG. 4 that has a thickness of 0 nm. As a result, medium-resistance regions can be formed between the channel region and the source/drain regions (under the ends of the channel protection layer).

In the case where the ends of the channel protection layer are machined to have a forward tapered shape, the hydrogen concentration of a part of the oxide semiconductor layer that is under the forward tapered region is varied depending on how thick the channel protection layer which is just above the position where the hydrogen concentration is measured. The hydrogen concentration of the oxide semiconductor layer in this case continuously shifts so as to increase from a region underneath the central part of the channel protection layer towards the ends thereof. Similarly, the resistivity of the oxide semiconductor layer continuously shifts so as to decrease from a region underneath the central part of the channel protection layer towards a region underneath the ends thereof. The continuous shift in resistivity improves the contact between the channel region and the source/drain regions and prevents electric field concentration at the source/drain ends more effectively than when the resistivity does not shift in a continuous manner.

The length of each medium-resistance region in the channel length direction is not particularly limited but, desirably, the lower limit is determined taking into account the uniformity and restrictions in machining on the substrate plane. The resistance of the medium-resistance region, when becoming larger compared to the channel resistance, causes current rate control. The upper limit of the length of the medium-resistance region is therefore desirably kept to a length that does not allow the medium-resistance region to cause current rate control.

With the gate electrode formed under the medium-resistance region, current rate control due to the medium-resistance region is prevented from affecting the TFT in an ON state. The structure as this is sometimes called a gate overlap type.

(Forming the Interlayer Insulating Layer)

Figure 5:
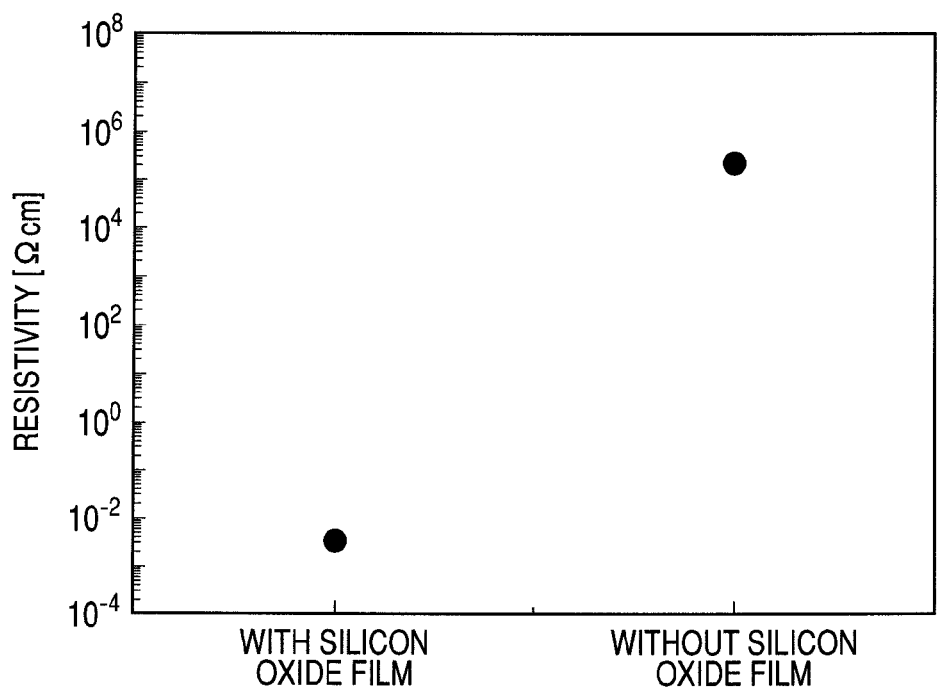
FIG. 5 is a graph illustrating a change in resistivity of the amorphous IGZO oxide semiconductor in relation to presence or absence of a silicon nitride film insulating layer.

The interlayer insulating layer 15 is formed next. An insulating layer formed by the plasma-enhanced CVD method from a raw material that contains hydrogen, such as a silicon nitride film or a silicon oxide film, is used as the interlayer insulating layer 15. The interlayer insulating layer 15 is required to have a function of lowering the resistance of the oxide semiconductor layer 13 when formed directly on the oxide semiconductor layer 13. The resistance of an oxide semiconductor is reduced by doping the oxide semiconductor with hydrogen, and hence the interlayer insulating layer 15 is required to be an insulating layer containing hydrogen. Specifically, a silicon nitride film, a silicon oxide film, a silicon oxynitride film, and a silicon carbide film that contain hydrogen are desirable as well as a laminate of those films. No problems arise even if the compositions of those insulating layers do not follow stoichiometry. A plasma-enhanced CVD method that uses raw material gas containing hydrogen is desirable as a method of forming the interlayer insulating layer 15, in light of the plasma's effect of accelerating hydrogen diffusion to an oxide semiconductor. FIG. 5 illustrates the result of a comparison conducted by the inventors of the present invention between the resistivity of an amorphous IGZO layer with a silicon nitride film formed on top by the plasma-enhanced CVD method and the resistivity of the amorphous IGZO layer without the silicon nitride film formed on top. It can be seen in FIG. 5 that the resistivity of the amorphous IGZO layer with the silicon nitride film is approximately $10^{-8}$ times the resistivity of the amorphous IGZO layer without the silicon nitride film. This proves that a silicon nitride film formed by the plasma-enhanced CVD method has a function of lowering the resistance of the amorphous oxide semiconductor. The same effect is obtained from some raw materials that contain nitrogen.

With the interlayer insulating layer 15 formed on the oxide semiconductor layer 13 in the manner described above, hydrogen in the raw material of the interlayer insulating layer 15 diffuses to the oxide semiconductor layer 13 and lowers the resistance of a region of the oxide semiconductor layer 13 that is not covered with the channel protection layer 14. The drain electrode 13a and the source electrode 13b are thus formed. The drain electrode 13a, the source electrode 13b, and the channel region 13c are formed in the same layer, and hence the resultant TFT is a coplanar structure TFT small in parasitic resistance.

In the case where back side exposure using the gate electrode 11 as a mask is employed, the drain electrode 13a and the source electrode 13b are formed with the channel protection layer 14, which has been formed in a self-aligning manner, as a mask. This makes the drain/source regions overlap less with the gate electrode and, accordingly, a TFT that is small in parasitic capacitance can be manufactured.

In the channel protection layer 14, the ends 18, where the channel protection layer 14 is thin, transmit more hydrogen than the central part 19. The resistivity of the part of the oxide semiconductor layer 13 that is under the ends 18 is therefore lower than that of the part under the central part 19 (channel region 13c). A medium-resistance region 13d whose resistivity is lower than that of the channel region 13c and higher than that of the drain/source regions 13a and 13b is thus formed between the channel region 13c and the drain region 13a, and between the channel region 13c and the source region 13b. The medium-resistance regions 13d relieve electric field concentration at the drain/source ends, thereby preventing hot carrier induced degradation of the TFT. An oxide semiconductor thin film transistor that undergoes only a small change in threshold voltage under electrical stress is thus provided.

(Forming the Drain/Source Wiring Lines)

Thereafter, contact holes are formed by the photolithography method and the etching method to form the drain wiring line 16 and the source wiring line 17 for electric connection with the outside. The drain/source wiring layer can be formed by such methods as the sputtering method, the pulse laser deposition (PLD) method, the electron beam deposition method, and the CVD method. Any electrode material that has good electric conductivity can be used. Examples of employable electrode materials include metal electrode materials which are metal such as Ti, Pt, Au, Ni, Al and Mo, and alloys of those metal elements, a laminate film of the metal electrode materials, and oxide conductors such as ITO. Alternatively, the drain electrode 13a and the source electrode 13b can serve as drain/source wiring lines without requiring any modifications.

A bottom gate type coplanar structure oxide semiconductor TFT is thus completed. In the present invention, multiple transistors structured as above can be arranged two-dimensionally on a substrate (arranged in crosswise and lengthwise directions as if forming a plane).

(Top Gate Type Thin Film Transistor)

A top gate type thin film transistor to which the present invention is applied and a method of manufacturing the TFT is now described with reference to FIG. 6.

First, the oxide semiconductor layer 13 is formed on the substrate 10. The substrate 10 used here and the oxide semiconductor layer 13 formed here are the same as those in the bottom gate type TFT. The oxide semiconductor layer 13 is then patterned by the photolithography method and the etching method. Next, an insulating layer to serve as the channel protection layer 14 is formed on the oxide semiconductor layer 13 by the same method that is employed for the bottom gate type, and then patterned such that the channel protection layer 14 is thinner at the ends 18 than at the central part 19. The channel protection layer 14 may have two or more layers as in the bottom gate type. Subsequently, a first interlayer insulating layer 15a is formed from a raw material containing hydrogen. At this point, the drain electrode 13a, the source electrode 13b, and the medium-resistance regions 13d are formed simultaneously. The channel protection layer 14 and the first interlayer insulating layer 15a function as a gate insulating layer 12a and a gate insulating layer 12b, respectively.

Figure 7:
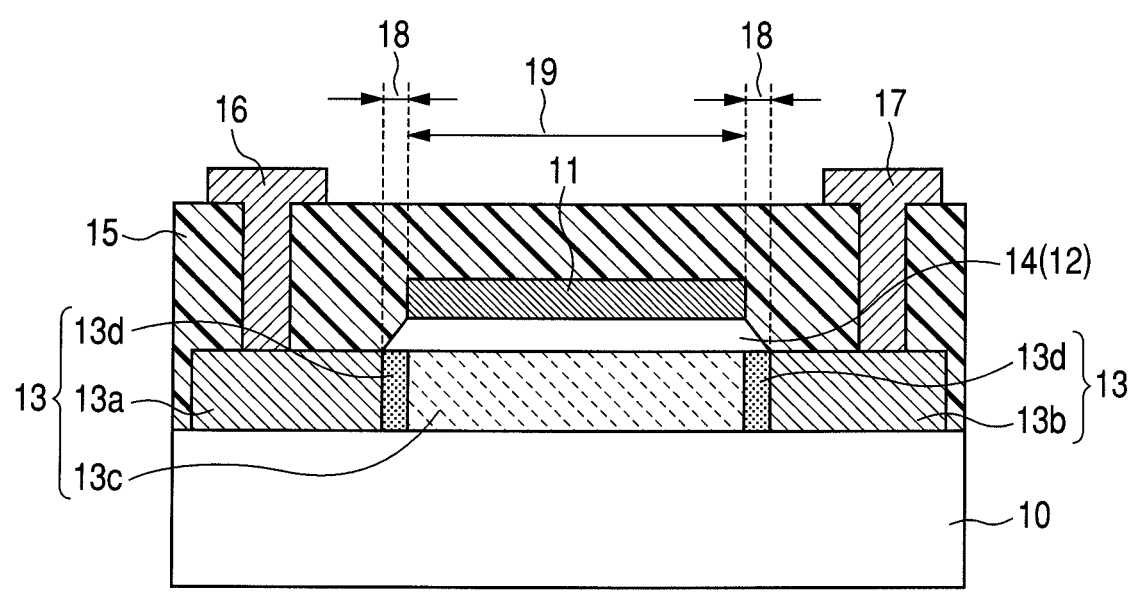
FIG. 7 is a diagram schematically illustrating a mode of carrying out the top gate type coplanar structure oxide semiconductor TFT of the present invention (with a gate not overlapped)

The gate electrode 11 is formed on the first interlayer insulating layer 15a. The material and formation method employed for the gate electrode 11 here are the same as those in the manufacture of the bottom gate type TFT. The gate electrode 11 is desirably placed on top of the entire region where the oxide semiconductor layer 13 and the channel protection layer 14 overlap, so that current rate control due to the medium-resistance region 13d is prevented from affecting the TFT in an ON state. A second interlayer insulating layer 15b is formed in the same way that the first interlayer insulating layer 15a is formed. Alternatively, the gate electrode 11 may be formed directly on the channel protection layer 14 with the interlayer insulating layer 15 formed on the gate electrode 11 as illustrated in FIG. 7. In this case, the channel protection layer 14 functions as the gate insulating layer 12. The gate electrode 11 in this case is not formed on the ends of the channel protection layer 14 where the channel protection layer 14 is thin (namely, the forward tapered part).

Thereafter, contact holes are formed by the photolithography method and the etching method to form the drain wiring line 16 and the source wiring line 17 for electric connection with the outside.

A top gate type coplanar structure oxide semiconductor TFT is thus completed. In the present invention, multiple transistors structured as above can be arranged two-dimensionally on a substrate (arranged in crosswise and lengthwise directions as if forming a plane).

Given below is a description on a mode of carrying out a display device that uses the thin film transistor of the present invention.

A display device is built by connecting electrodes of display devices such as organic electro-luminescence (EL) devices or liquid crystal devices to source wiring lines, which are output terminals of TFTs according to the present invention. A specific example of the structure of the display device is described below with reference to FIG. 8, which is a sectional view of the display device.

Figure 8:
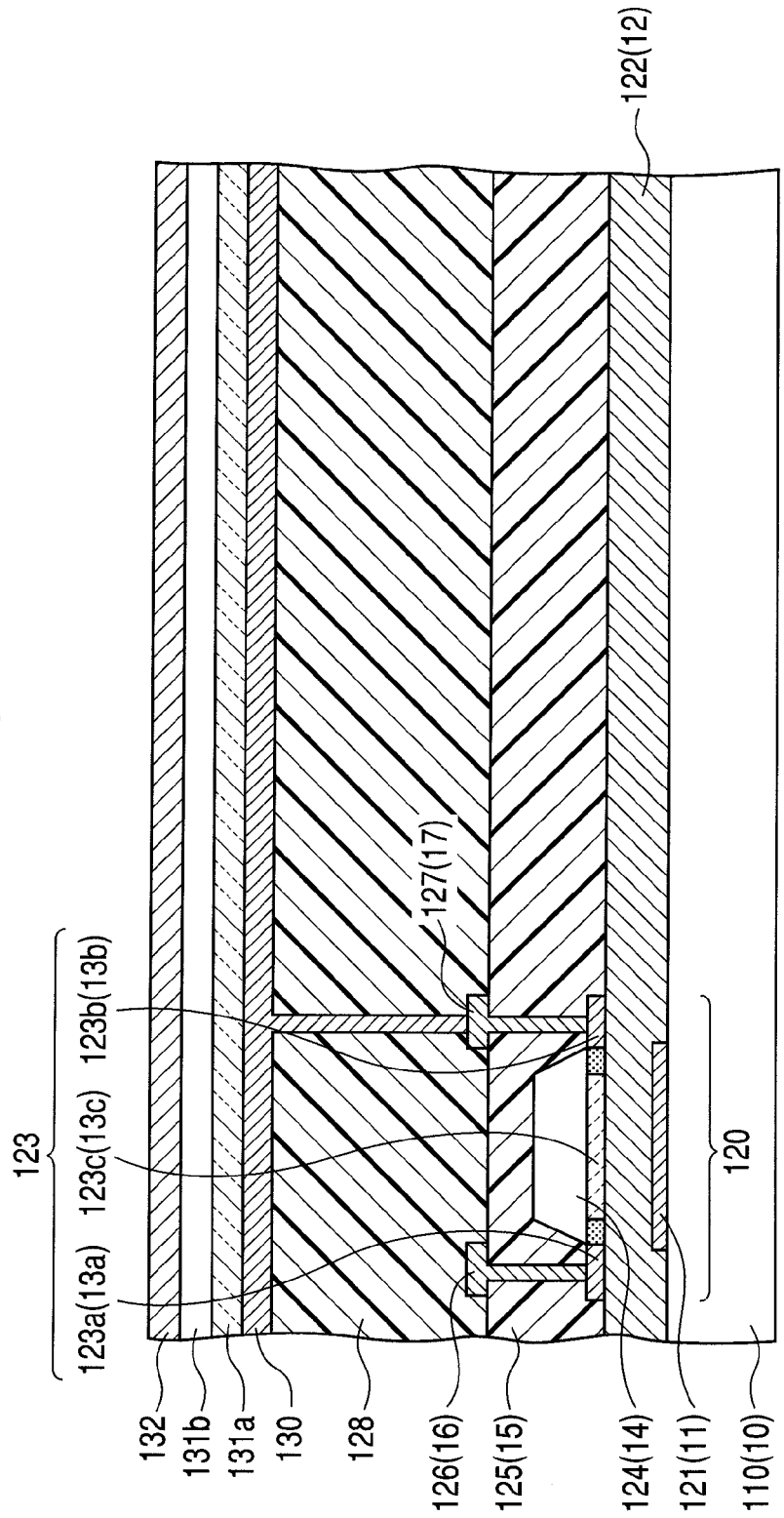
FIG. 8 is a sectional view of an example of a display device according to the present invention.

As illustrated in FIG. 8, an oxide semiconductor TFT 120 is formed on a substrate 110. The oxide semiconductor TFT 120 includes: a gate electrode 121; a gate insulating layer 122; an oxide semiconductor layer 123 (including a drain electrode (region) 123a, a source electrode (region) 123b, and a channel region 123c); a channel protection layer 124; an interlayer insulating layer 125; a drain wiring line 126; and a source wiring line 127.

Those components 110, 121, 122, 123, 123a, 123b, 123c, 124, 125, 126, and 127 correspond to what are denoted in the above-mentioned FIG. 1 by Reference Symbols 10, 11, 12, 13, 13a, 13b, 13c, 14, 15, 16, and 17, respectively. In the present invention, multiple oxide semiconductor TFTs structured as above can be arranged two-dimensionally on a substrate (arranged in crosswise and lengthwise directions as if forming a plane). First, an insulating layer 128 is formed on the oxide semiconductor TFT 120 and a contact hole is formed in the insulating layer 128. Next, an electrode 130 is connected to the source wiring line 127, and a hole transport layer 131a and a light-emitting layer 131b are formed on the electrode 130. An electrode 132 is formed on the light-emitting layer 131b. With this structure, a current injected into the light-emitting layer 131b can be controlled by means of the value of a current that flows from the drain wiring line 126 to the source wiring line 127 through a channel formed in the amorphous oxide semiconductor channel region 123c. The injected current can accordingly be controlled via the voltage of the gate electrode 121 of the oxide semiconductor TFT 120. The electrode 130, the hole transport layer 131a, the light-emitting layer 131b, and the electrode 132 constitute an organic electro-luminescence device.

Figure 9:
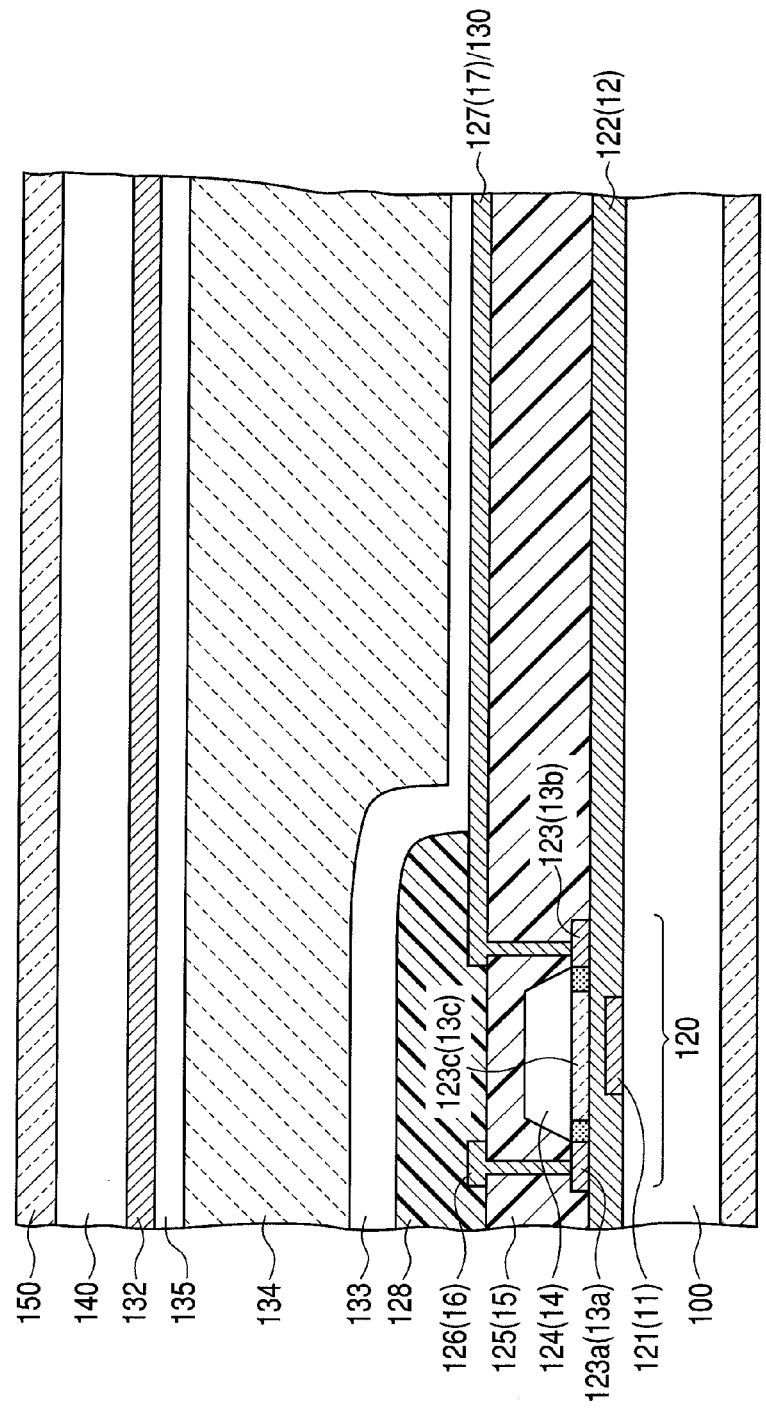
FIG. 9 is a sectional view of another example of the display device according to the present invention.

Alternatively, a structure illustrated in FIG. 9 may be employed in which the source wiring line 127 is extended to form the electrode 130, so that the electrode 130 is used to apply voltage to a liquid crystal cell or electrophoretic particle cell 134, which is sandwiched between high resistance layers 133 and 135. (The source wiring line and the drain wiring line cannot clearly be discriminated from each other in the structure of FIG. 9. For the convenience of description, a wiring line that is connected to the electrode 130 is referred to as source wiring line.) The liquid crystal cell or electrophoretic particle cell 134, the high resistance layers 133 and 135, the electrode 130, and the electrode 132 constitute a display device. A voltage applied to the display device can be controlled by means of a storage capacitor, which is not illustrated in FIG. 9, and the value of a current that flows from the drain wiring line 126 to the source wiring line 127 through a channel formed in the amorphous oxide semiconductor channel region 123c. The voltage can accordingly be controlled via the voltage of the gate electrode 121 of the oxide semiconductor TFT 120. The high resistance layers 133 and 135 are unnecessary in the case where the display medium of the display device is a capsule that seals a fluid and particles inside an insulating coat.

EXAMPLES

The present invention is described in more detail through the following examples. However, the present invention is in no way limited by the examples.

Example 1

The bottom gate type coplanar structure oxide semiconductor TFT illustrated in FIG. 1 in which the channel protection layer is a single layer was manufactured in this example.

First, an electrode layer for forming the gate electrode 11 was formed by the electron beam deposition method on the glass substrate 10 (Corning 1737 manufactured by Corning Incorporated). The electrode material used is Ti/Au/Ti, and the thicknesses of the Ti layer, the Au layer, and the other Ti layer are 5 nm, 40 nm, and 5 nm, respectively.

After that, the electrode layer was patterned by the photolithography method, thereby obtaining the gate electrode 11.

A silicon oxide film with a thickness of 200 nm was formed as the gate insulating layer 12 by the sputtering method. In order to form the silicon oxide film, an RF sputtering apparatus was used and the substrate temperature was set to room temperature. A 3-inch diameter $SiO_2$ target was used with the input RF power set to 400 W. During the film formation, the atmosphere was set to a total pressure of 0.5 Pa and the gas flow rate was set to Ar=100%.

An amorphous IGZO film with a thickness of 30 nm was formed as the oxide semiconductor layer 13. In order to form the oxide semiconductor layer 13, the RF sputtering apparatus was used and the substrate temperature was set to room temperature (25° C.). A 3-inch diameter target of a polycrystalline sintered body having an $InGaZnO_4$ composition was used with the input RF power set to 200 W. During the film formation, the atmosphere was set to a total pressure of 0.5 Pa and the gas flow rate was set to $Ar:O_2$=95:5. Then, the oxide semiconductor layer 13 was patterned by the photolithography method.

On the oxide semiconductor layer 13, a silicon oxide film was formed to have a thickness of 300 nm by the sputtering method as the channel protection layer 14. In order to form the silicon oxide film, the RF sputtering apparatus was used and the substrate temperature was set to room temperature. A 3-inch diameter $SiO_2$ target was used with the input RF power set to 400 W. During the formation of the silicon oxide film, the atmosphere was set to a total pressure of 0.1 Pa and the gas flow rate was set to $Ar:O_2$=50:50.

The channel protection layer 14 was patterned by the photolithography method. A resist used for the patterning was AZ 1500 (20 cp) manufactured by AZ Electronic Materials. The temperature and length of pre-baking were set to 90° C. and 20 minutes, respectively, and the temperature and length of post-baking were set to 120° C. and 10 minutes, respectively. In this case, the resist pattern had a forward tapered shape and the taper angle was set to about 20°. An RIE (Reactive Ion Etching) apparatus was used for dry etching. The etching was performed with $CF_4$ as etching gas, and with the input RF power and the pressure set to 150 W and 5 Pa, respectively. As a result, the channel protection layer 14 had a forward tapered shape and a taper angle of approximately 10°.

A silicon nitride film was formed to have a thickness of 300 nm by the plasma-enhanced CVD method as the interlayer insulating layer 15. The substrate temperature was set to 250° C. in this plasma-enhanced CVD process for forming the silicon nitride film. $SiH_4$, $NH_3$, and $N_2$ were used as process gas. The gas flow rate was set to $SiH_4:NH_3:N_2$=1:2.5:25. The input RF power density and the pressure were set to 0.9 $W/cm^2$ and 150 Pa, respectively. Regions of the oxide semiconductor layer, which were not covered with the channel protection layer 14, were turned into the drain electrode 13a and the source electrode 13b at the same time when the interlayer insulating layer 15 was formed. Further, regions of the oxide semiconductor layer 13, which are under the forward tapered regions at ends of the channel protection layer 14, were turned into the medium-resistance regions 13d. Contact holes were formed in the interlayer insulating layer 15 by the photolithography method and the etching method.

An electrode layer for forming the drain wiring line 16 and the source wiring line 17 was formed next by the electron beam deposition method. The electrode material used was Ti/Au/Ti, and the thicknesses of the Ti layer, the Au layer, and the other Ti layer were 5 nm, 300 nm, and 5 nm, respectively. Then, the drain wiring line 16 and the source wiring line 17 were patterned by the photolithography method.

Lastly, a heating furnace was used to perform a 0.5-hour annealing treatment in the atmospheric air at 200° C. to remove damage caused by dry etching.

Through the above-mentioned steps, the oxide semiconductor TFT was completed.

Figure 10:
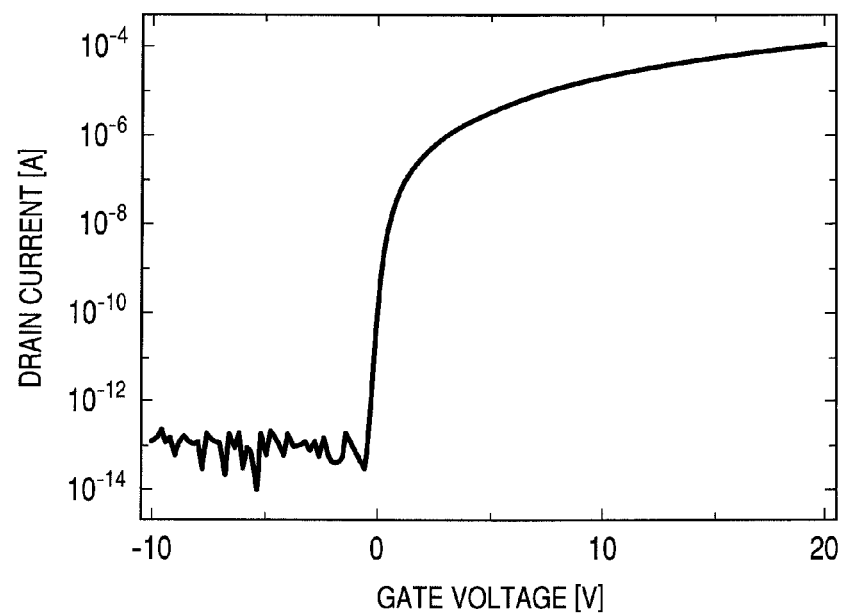
FIG. 10 is a graph illustrating results of measuring transmission characteristics of a bottom gate type coplanar structure oxide semiconductor TFT that has a channel protection layer of the present invention, under a measurement condition that sets a drain voltage to 12 V.
Figure 11:
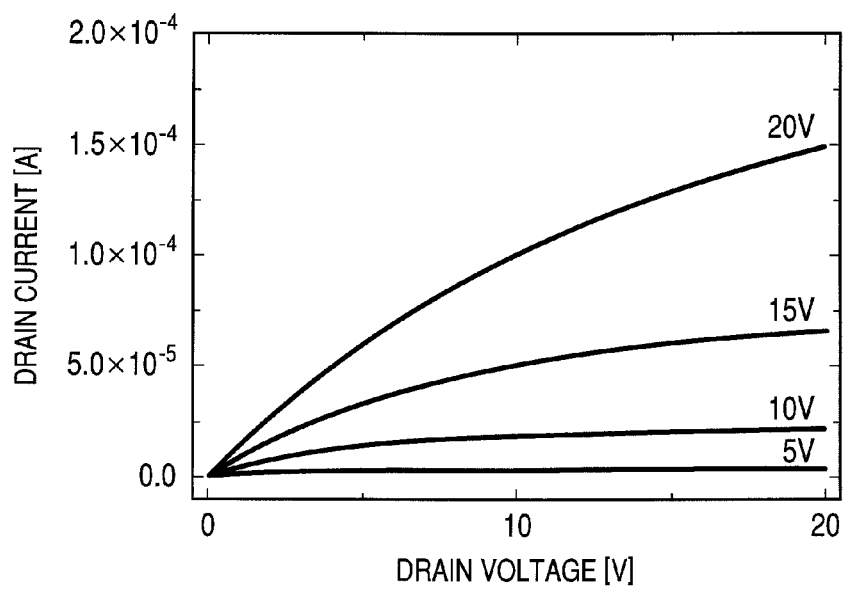
FIG. 11 is a graph illustrating results of measuring the transmission characteristics of the bottom gate type coplanar structure oxide semiconductor TFT that has the channel protection layer of the present invention, under a measurement condition that sets a gate voltage to 5 V, 10 V, 15 V, and 20 V.

The transmission characteristics and output characteristics of eighteen oxide semiconductor TFTs manufactured in this example are illustrated in FIG. 10 and FIG. 11, respectively. The TFTs were measured to have a field effect mobility of approximately 5 cm$^2$/V·s, an S value of approximately 0.15 V/decade, and an ON/OFF ratio of approximately 10$^9$.

As can be seen from FIGS. 10 and 11, the oxide semiconductor TFT of this example exhibited excellent characteristics in which the parasitic resistance was small and the threshold voltage underwent a small change under electrical stress.

Example 2

The bottom gate type coplanar structure oxide semiconductor TFT illustrated in FIG. 2A in which the channel protection layer is formed of two layers was manufactured in this example.

First, the gate electrode 11, the gate insulating layer 12, and the oxide semiconductor layer 13 are formed on the glass substrate 10 in the same manner as in Example 1.

On the oxide semiconductor layer 13, a silicon oxide film is formed to have a thickness of 10 nm by the sputtering method as the first channel protection layer 14a. Film formation conditions of the first channel protection layer 14a are the same as those of the channel protection layer 14 of Example 1. The first channel protection layer 14a is then patterned by the photolithography method and the dry etching method.

A silicon oxide film with a thickness of 300 nm is formed next by the sputtering method as the second channel protection layer 14b. Film formation conditions of the second channel protection layer 14b are the same as those of the channel protection layer 14 of Example 1. The second channel protection layer 14b is then patterned by the photolithography method and the dry etching method.

As the interlayer insulating layer 15, a silicon nitride film is formed to have a thickness of 300 nm by the plasma-enhanced CVD method. Film formation conditions of the interlayer insulating layer 15 are the same as those of the interlayer insulating layer 15 of Example 1. Regions of the oxide semiconductor layer 13, which are not covered with the channel protection layers 14a and 14b are turned into the drain electrode 13a and the source electrode 13b at the same time when the interlayer insulating layer 15 is formed. Further, regions of the oxide semiconductor layer 13, which are under thin regions in which the channel protection layer 14a alone is present, are turned into the medium-resistance regions 13d.

Contact holes are then formed in the interlayer insulating layer 15 in the same way as Example 1 to form the drain wiring line 16 and the source wiring line 17.

Lastly, a heating furnace is used to perform annealing treatment in the same way as Example 1, whereby the oxide semiconductor TFT is completed.

The oxide semiconductor TFT of this example exhibited excellent characteristics in which the parasitic resistance was small and the threshold voltage underwent a small change under electrical stress.

Example 3

A display device that uses the bottom gate type coplanar structure oxide semiconductor TFT illustrated in FIG. 8 was manufactured in this example.

The oxide semiconductor TFT manufacturing steps employed here are the same as those of the above-mentioned Example 1. However, the display device may use any of the oxide semiconductor TFTs illustrated in FIGS. 1, 2A, and 2B. First, a silicon nitride film is formed by the plasma-enhanced CVD method as the insulating layer 128 on the oxide semiconductor TFT 120 of the present invention. A contact hole is formed in the insulating layer 128 by the photolithography method. The electrode 130 is connected to the source wiring line 127 through the insulating layer 128. The electrode 130 is an ITO film formed by the sputtering method. On the electrode 130, the hole transport layer 131a and the light-emitting layer 131b are formed by deposition. α-NPD and Al$_{q3}$ are used for the hole transport layer 131a and the light-emitting layer 131b, respectively. The electrode 132 is formed on the light-emitting layer 131b. The electrode material used is MgAg.

A display device illustrated in FIG. 8 that has the organic electro-luminescence device as a display device was thus manufactured.

Example 4

A display device that uses the bottom gate type coplanar structure oxide semiconductor TFT illustrated in FIG. 9 was manufactured in this example.

The oxide semiconductor TFT manufacturing steps employed here are the same as those of the above-mentioned Example 1. However, the display device can use any of the oxide semiconductor TFTs illustrated in FIGS. 1, 2A, and 2B. In the oxide semiconductor TFT 120, the drain wiring line 126 and the source wiring line 127 are replaced by an ITO film, and a shorter side of the insular ITO film is extended to 100 μm. The oxide semiconductor TFT 120 is then covered with the insulating layer 128 while 90 μm of the extended side is left uncovered in order to secure the drain wiring line 126 and a wiring line extending to the gate electrode 121. Polyimide is applied to the insulating layer 128 to form the polyimide film 133, and a rubbing step is executed.

Meanwhile, a substrate 140 made of the same plastic is prepared by forming the ITO film 132 and the polyimide film 135 on the substrate 140 and executing a rubbing step. The substrate 140 and the substrate 120 on which the oxide semiconductor TFT 120 has been formed are faced with a 5-μm gap therebetween. The nematic liquid crystal 134 is injected into the gap. This structure is sandwiched by a pair of polarizing plates 100 and 150. When the applied voltage of the gate electrode 121 is changed by applying a voltage to the drain wiring line 126 of the oxide semiconductor TFT 120, the light transmittance is changed only in a 30 μm×90 μm region which is a part of the insular ITO film extended from the source wiring line 127. This light transmittance can be controlled to shift in a continuous manner via the source-drain voltage as well when the gate voltage is at a level that puts the oxide semiconductor TFT 120 into an ON state. A display device illustrated in FIG. 9 that has the liquid crystal cell as a display device is thus manufactured.

Example 5

In this example, a white plastic substrate is used as the substrate 110 on which the oxide semiconductor TFT of Example 4 is formed, and the electrodes of the oxide semiconductor TFT 120 are replaced with gold films, whereby the polyimide films 133 and 135 and the polarizing plates 100 and 140 are eliminated. The gap between the white plastic substrate 110 and the transparent plastic substrate 150 is filled with capsules 134, which is obtained by coating particles and a fluid with an insulating coat. In a case of a display device structured in this manner, a voltage between the extended drain wiring line and the ITO film above is controlled by the oxide semiconductor TFT of the present invention, and particles contained in the capsules move up and down. The reflectance of the extended source wiring line region viewed from the transparent substrate side is thus controlled, and the display device displays an image or the like by controlling this reflectance.

Example 6

Figure 6:
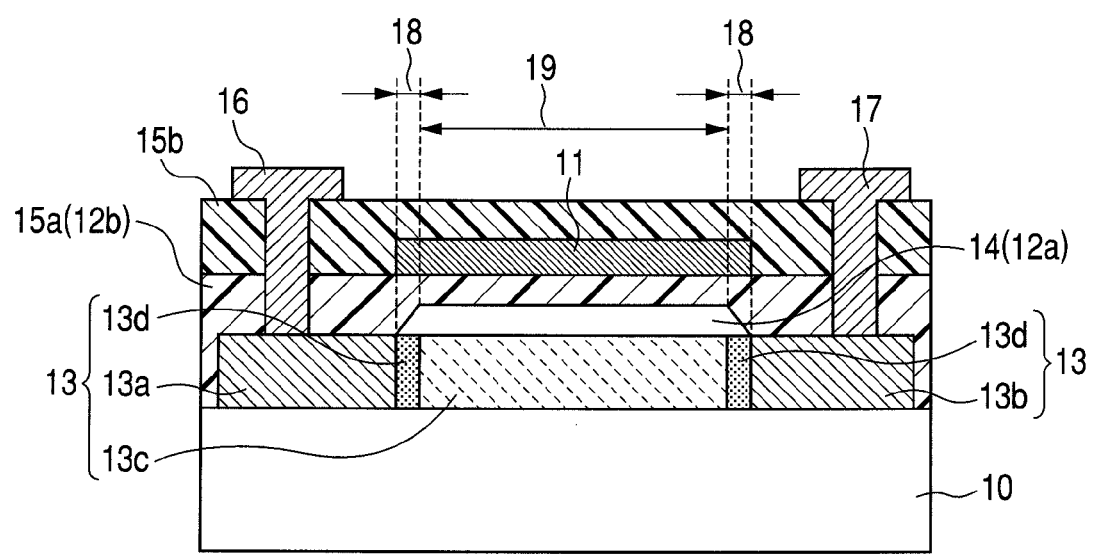
FIG. 6 is a diagram schematically illustrating a mode of carrying out a top gate type coplanar structure oxide semiconductor TFT of the present invention (with a gate overlapped)

The top gate type coplanar structure oxide semiconductor TFT illustrated in FIG. 6 was manufactured in this example.

First, the oxide semiconductor layer 13 is formed on the glass substrate 10. The oxide semiconductor layer 13 is formed in the same way as Example 1. The oxide semiconductor layer 13 is then patterned by the photolithography method.

On the oxide semiconductor layer 13, a silicon oxide film is formed to have a thickness of 300 nm by the sputtering method as the channel protection layer 14. The channel protection layer 14 is then patterned by the photolithography method. The same method as in Example 1 is used to pattern the channel protection layer 14, thereby giving the channel protection layer 14 a forward tapered shape.

As the first interlayer insulating layer 15a, a silicon nitride film is formed to have a thickness of 200 nm by the plasma-enhanced CVD method. Film formation conditions of the first interlayer insulating layer 15a are the same as those of the interlayer insulating layer 15 of Example 1. Regions of the oxide semiconductor layer 13, which are not covered with the channel protection layer 14, are turned into the drain electrode 13a and the source electrode 13b at the same time when the interlayer insulating layer 15 is formed. Further, regions of the oxide semiconductor layer 13 that are under thin regions where the channel protection layer 14 alone is present are turned into the medium-resistance regions 13d. The channel protection layer 14 and the first interlayer insulating layer 15a function as the first gate insulating layer 12a and the second gate insulating layer 12b, respectively.

On the first interlayer insulating layer 15a, an Mo film with a thickness of 100 nm is formed by the sputtering method as the gate electrode 11. The gate electrode 11 is patterned by the photolithography method.

As the second interlayer insulating layer 15b, a silicon nitride film is formed to have a thickness of 300 nm by the plasma-enhanced CVD method. Contact holes are formed in the first interlayer insulating layer 15a and the second interlayer insulating layer 15b in the same way as Example 1, to form the drain wiring line 16 and the source wiring line 17.

Lastly, the same annealing treatment as in Example 1 is performed in a heating furnace, whereby the oxide semiconductor TFT is completed.

The oxide semiconductor TFT of this example exhibits excellent characteristics in which the parasitic resistance is small and the threshold voltage undergoes a small change under electrical stress.

The oxide semiconductor TFT of the present invention is applicable as a switching device or driving device of a liquid crystal display device or an organic EL display device. Further, an oxide semiconductor TFT of the present invention, which can be formed on a flexible material such as a plastic film at low temperature, has a wide range of application including flexible display devices, IC cards, ID tags, and flexible sensors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-121384, filed May 7, 2008, which is hereby incorporated by reference herein in its entirety.

The invention claimed is:

1. A thin film transistor, comprising on a substrate at least:
a gate electrode;
a gate insulating layer on the gate electrode;
an oxide semiconductor layer on the gate insulating layer;
a channel protection layer on the oxide semiconductor layer; and
an insulating interlayer which contains hydrogen and has an intermediate region contacts with the channel protection layer and two outer regions, each of which contacts with the oxide semiconductor layer outside of the intermediate region, respectively,
wherein the oxide semiconductor layer contains an amorphous In—Ga—Zn—O as a major component,
wherein the channel protection layer has at least one layer containing a silicon oxide as a major component in contact with the oxide semiconductor layer,
wherein the channel protection layer has a central part and two thinner end parts, each of which is thinner than the central part so as to be a hydrogen transmittance path from the insulating interlayer to the oxide semiconductor layer, and both of which sandwich the central part, and
wherein the oxide semiconductor layer has, in a coplanar arrangement, a channel region underneath the central part of the channel protection layer, a source electrode underneath one of the two outer regions, a drain electrode underneath the other of the two outer regions, and each of two medium-resistance regions underneath each of the two thinner end parts, respectively.

2. A thin film transistor according to claim 1,
wherein the channel protection layer is made of one layer, and
wherein each of the two thinner end parts is a forward tapered shape respectively.

3. A thin film transistor according to claim 2, wherein a hydrogen concentration of one region of the oxide semiconductor layer underneath the central part of the channel protection layer is smaller than that of the other region of the oxide semiconductor layer underneath the each of the two thinner end parts.

4. A thin film transistor according to claim 1,
wherein the channel protection layer includes two layers formed of a first channel protection layer and a second channel protection layer, and
wherein the second channel protection layer is laminated on the first channel protection layer.

5. A thin film transistor according to claim 1, wherein the gate electrode is formed below a region in which the channel protection layer and the oxide semiconductor layer overlap each other.

6. A thin film transistor according to claim 1, wherein the insulating interlayer comprises any one of a silicon nitride film, a silicon oxide film, a silicon oxynitride film, a silicon carbide film, and a laminated film thereof.

7. A display device comprising:
the thin film transistor according to claim 1; and
a display element has at least one electrode electrically connected to either of the source electrode or the drain electrode of the thin film transistor.

8. A display device according to claim 7, wherein the display element comprises an electro-luminescence device.

9. A display device according to claim 7, wherein the display element comprises a liquid crystal cell.

10. A display device according to claim 7, wherein a plurality of the display elements and a plurality of the thin film transistors are arranged two-dimensionally on the substrate.

\* \* \* \* \*